(12) United States Patent
Shibuya

(10) Patent No.: US 11,842,952 B2
(45) Date of Patent: Dec. 12, 2023

(54) DOUBLE SIDE HEAT DISSIPATION FOR SILICON CHIP PACKAGE

(71) Applicant: Texas Instruments Incorporated, Dallas, TX (US)

(72) Inventor: Makoto Shibuya, Beppu (JP)

(73) Assignee: Texas Instruments Incorporated, Dallas, TX (US)

( * ) Notice: Subject to any disclaimer, the term of this patent is extended or adjusted under 35 U.S.C. 154(b) by 109 days.

(21) Appl. No.: 17/158,152

(22) Filed: Jan. 26, 2021

(65) Prior Publication Data
US 2021/0151365 A1    May 20, 2021

Related U.S. Application Data

(62) Division of application No. 14/825,154, filed on Aug. 12, 2015, now abandoned.

(51) Int. Cl.
*H01L 23/495* (2006.01)
*H01L 21/78* (2006.01)
*H01L 21/48* (2006.01)

(52) U.S. Cl.
CPC .... *H01L 23/49568* (2013.01); *H01L 21/4842* (2013.01); *H01L 21/78* (2013.01); *H01L 23/49524* (2013.01); *H01L 23/49551* (2013.01); *H01L 23/49562* (2013.01); *H01L 2224/37147* (2013.01); *H01L 2224/38* (2013.01); *H01L 2224/40245* (2013.01); *H01L 2224/97* (2013.01)

(58) Field of Classification Search
CPC ........... H01L 23/49551; H01L 21/4871; H01L 23/49541–49568; H01L 21/4842; H01L 21/78
See application file for complete search history.

(56) References Cited

U.S. PATENT DOCUMENTS

| | | | |
|---|---|---|---|
| 6,566,749 B1 * | 5/2003 | Joshi | H01L 23/04 257/589 |
| 7,001,799 B1 | 2/2006 | Edwards et al. | |
| 7,256,479 B2 | 8/2007 | Noquil et al. | |
| 8,188,587 B2 * | 5/2012 | Jereza | H01L 24/40 257/676 |
| 2004/0150082 A1 * | 8/2004 | Kajiwara | H01L 24/97 257/E23.044 |
| 2005/0093135 A1 | 5/2005 | Liu et al. | |
| 2007/0108564 A1 | 5/2007 | Tang et al. | |
| 2008/0151627 A1 | 6/2008 | Lee et al. | |
| 2008/0224282 A1 * | 9/2008 | Ashida | H01L 23/49575 257/E23.044 |
| 2009/0039484 A1 | 2/2009 | Mahler et al. | |
| 2010/0008085 A1 | 1/2010 | Ivey et al. | |
| 2012/0038035 A1 | 2/2012 | Chang et al. | |
| 2012/0133037 A1 | 5/2012 | Cruz | |
| 2014/0374891 A1 | 12/2014 | Low et al. | |
| 2016/0005675 A1 | 1/2016 | Tong | |

* cited by examiner

*Primary Examiner* — Didarul A Mazumder
*Assistant Examiner* — Gustavo G Ramallo
(74) *Attorney, Agent, or Firm* — Dawn Jos; Frank D. Cimino

(57) ABSTRACT

System, method, and silicon chip package for providing structural strength, heat dissipation and electrical connectivity using "W" shaped frame bonded to the one or more dies, wherein the "W" shaped frame provides compression strength to the silicon chip package when the one or more dies are bonded, and electrically conductivity between for the one or more dies to leads of silicon chip package, and heat dissipation for the silicon chip package.

8 Claims, 9 Drawing Sheets

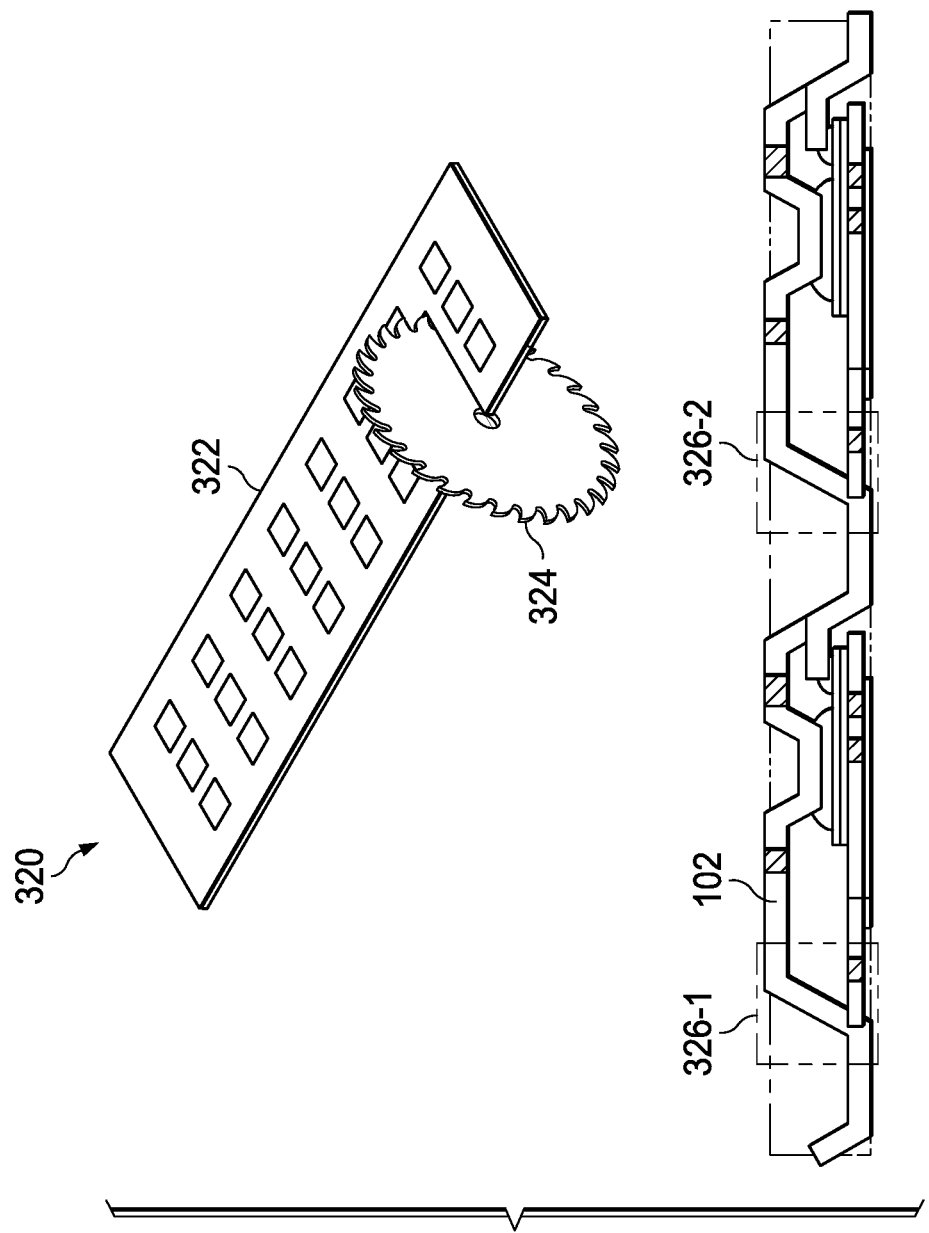

DOUBLE SIDE HEAT DISSIPATION FOR SILICON CHIP PACKAGE

CROSS-REFERENCE TO RELATED APPLICATIONS

This application is a divisional of and claims the benefit to U.S. patent application Ser. No. 14/825,154 filed on Aug. 12, 2015, the contents of which are incorporated herein by reference.

TECHNICAL FIELD

This invention relates generally to the field of silicon chip packaging, and particularly dual sided heat dissipating structures.

BACKGROUND

In silicon chip fabrication, a common trend is to provide for smaller chips to support ever increasingly smaller devices. Alternatively, more compact packaging of chips has become a solution to support increasingly smaller devices. Compact packaging becomes smaller packaging. Chip packaging is trending from through-hole design (THD) to surface mounted design (SMD). Further, requirements for such chip packaging are trending to higher power which leads to the need for better heat dissipation of the packages.

In addition to design requirements of chip packaging involving smaller or more compact designs, these chips use more power and generate high heat. There have been many efforts to design compact chips with improved heat dissipation including dual cool packages that dissipate heat from both sides of the chip package. These packages improve heat dissipation; however, the process of assembling the double-sided heat dissipation packages is complicated compared to single side heat dissipation packages.

SUMMARY

In accordance with an embodiment, a method for forming a dual sided chip package is provided. The method includes superimposing a frame with increased surface area to a large matrix array of one or more dies, bonding the frame to one or more dies, molding the frame to one or more dies with an upside mold die and a downside mold die, and singulating the joints of the frame to expose heat sinks.

In accordance with an embodiment, a silicon chip package is provided. The silicon chip package comprising: one or more dies, a frame bonded to the one or more dies. The frame provides compression strength to the silicon chip package when the one or more dies are bonded, and electrically conductivity between for the one or more dies to leads of silicon chip package.

In accordance with an embodiment, a system is provided. The system includes one or more processors; memory coupled to the one or more processors; and a chip package configured to the one or more processors and memory. The system further includes one or more dies; and a frame bonded to the one or more dies. The frame provides dual sided heat dissipation for the chip package and electrically conductivity between for the one or more dies.

BRIEF DESCRIPTION OF THE DRAWINGS

FIG. 3E illustrates an example singulation process according to some embodiment.

DETAILED DESCRIPTION

The following description provides many different embodiments, or examples, for implementing different features of the subject matter. These descriptions are merely for illustrative purposes and do not limit the scope of the invention.

Figure 1A:
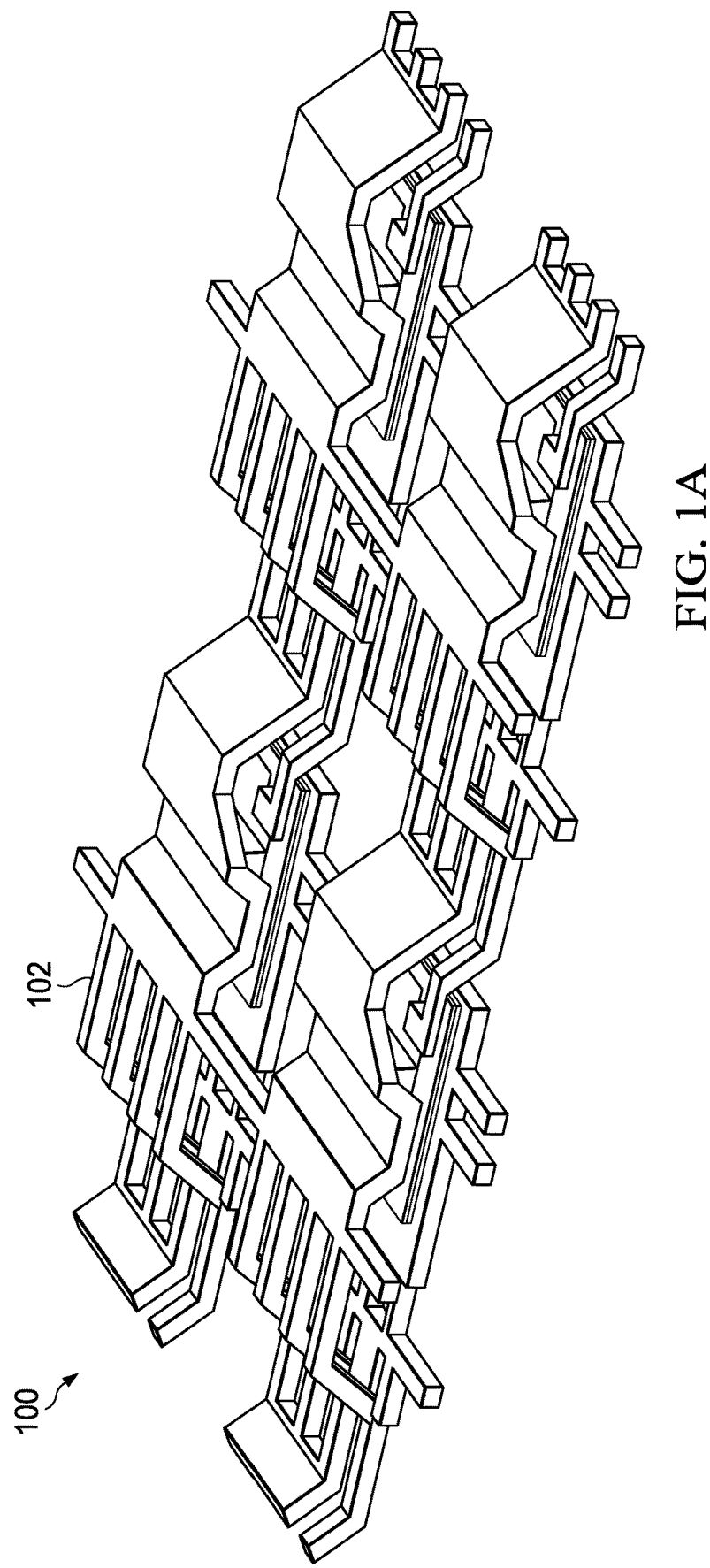
FIG. 1A is an isometric view of an example a "W" shaped clip for a chip package implementation according to some embodiment.

Referring to FIG. 1A, an isometric view of a heatsink frame clip 102 is shown for a chip package 100. The frame clip is shaped such to increase the surface mount area for better heat dissipation. In the present example the clip is "W" shaped; however, the frame clip can be shaped in any form to increase the surface mount area for increased heat dissipation for example the clip can be corrugated, bent, folded into alternate furrows and/or ridges, wrinkled, or the like. The chip package 100 can include quad flat non leads (QFN) packages. In the present example, the "W" shaped clip 102 provides structural strength for loads on a silicon chip. In particular, the "W" shaped clip 102 acts as pillars for structural strength for stress placed on the silicon chip. In addition, the "W" shaped clip 102 acts a dual sided heat disperser for a silicon chip package. In particular, the "W" shaped clip 102 provides a greater surface area on either side as compared to, for example, single sided structures. Other advantages of the "W" shaped clip or frame 102 include foregoing certain wire bonding processes, in particularly when "W" shaped clip 102 is made of electrically conductive material, such as copper (Cu) or similar material. The electrically conductive "W" shaped clip 102 also provides electrical connections.

The chip package 100 may be connected to or be part of a system, such as an electronic device (not shown). The electronic device may be a computing device, electronic control device, mobile device, or any other device that uses semiconductor chips. The device system may include one or more processors, memory, intra and inter connectivity that can include wireless and wired connections.

Figure 1B:
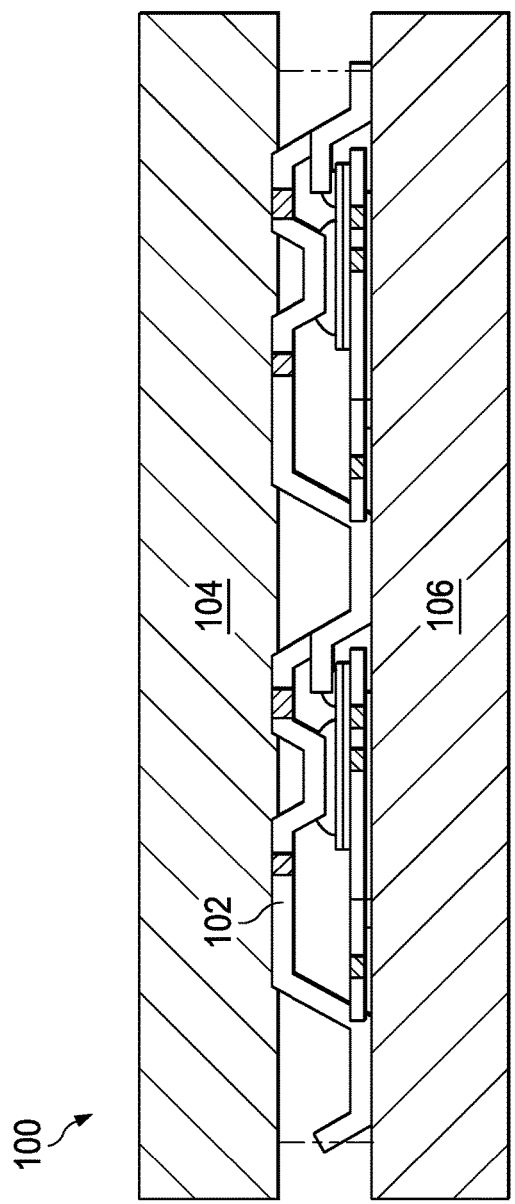
FIG. 1B is a cross sectional view of a "W" shaped clip for a chip package with upside die mold and downside die mold implementation according to some embodiment.
Figure 1C:
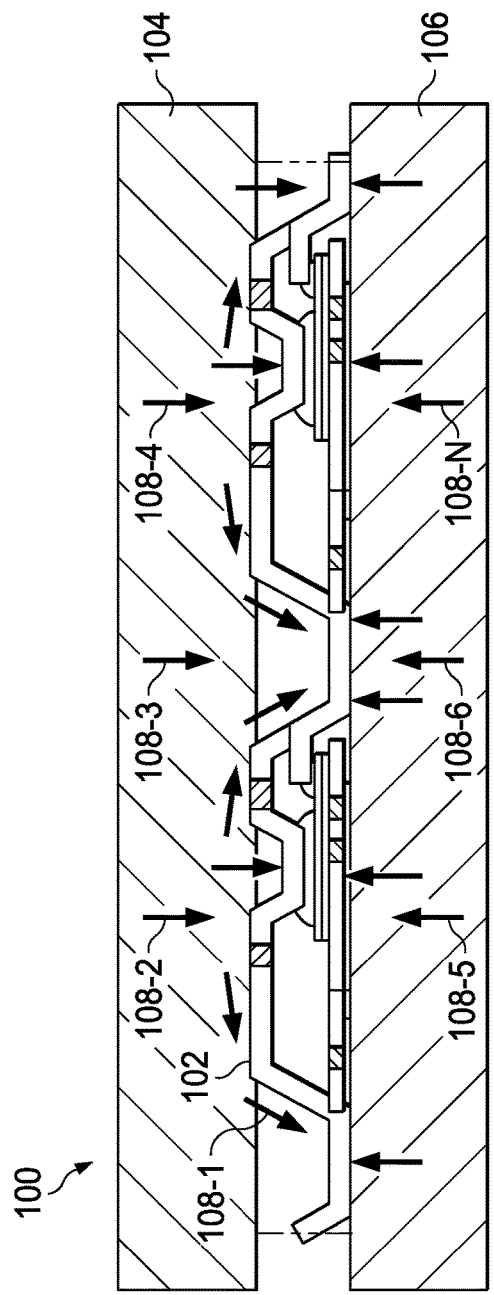
FIG. 1C is a cross sectional view of a "W" shaped clip for a chip package implementation showing clamping pressure from upside die mold and downside die mold according to some embodiment.

Referring to FIG. 1B, an example cross sectional view is shown of a "W" shaped clip 102 for a chip package 100. The "W" shaped clip or frame 102 is part of the chip package 100. The chip package 100 is formed with the W" shaped clip or frame 102 using an upside mold die 104 and a downside mold die 106. Referring to FIG. 1C, the upside die mold 104 and downside die mold 106 exert clamping pressure on the "W" shaped clip. During a molding process when upside die mold 104 and downside die mold 106 are applied to the chip package 100, clamping pressure as represented by arrows 108 is observed. The "W" shaped clip or frame 102 possess structural strength to support against such clamping pressure.

Figure 2:
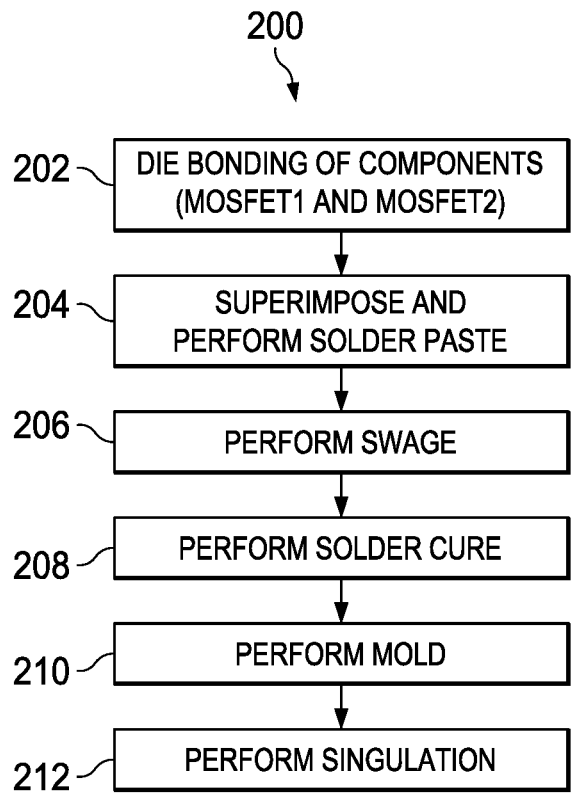
FIG. 2 illustrates an example flow diagram of a process for forming a silicon chip package for double sided heat dissipation according to some embodiment.

Referring to FIG. 2, an example flow diagram of a process for forming a silicon chip package for double sided heat dissipation is shown. The process 200 may be applied in forming the silicon chip package 100 described above. At 202, die bonding is performed. In this example, the die is metal oxide semiconductor field effect transistors (MOSFET); however, the process can be applied to any kind of semiconductor die. Further, multiple dies can also be bonded together for example, a MOSFET1 and MOSFET2 can be bonded together. In certain implementations, an electrical conductive "W" shaped clip or frame provide for gate, source, and drain connections of the MOSFETs.

At 204, dies are superimposed with the frame and the process of solder paste application is performed. In particular the electrical conductive "W" shaped clip or frame is superimposed over the bonded dies, such as MOSFETs. At 206, swaging is performed. Swaging includes pressing the electrical conductive "W" shaped clip or frame and bonded dies together. The shape of the "W" shaped clip or frame provides for strength for the chip package to withstand swaging. At 208, a solder cure is performed on electrical conductive "W" shaped clip or frame and bonded dies (MOSFETs). The molding of the chip is performed at 210. Molding for a dual sided package can involve an upside mold die and a downside mold die as discussed above. Because of the shape of the clip (such as "W" shaped in the present example), the mold die withstands the molding pressure. At 212, the singulation is performed. Singulation is a process of separating the chip package. Singulation can be performed at joints of the heat sink of the "W" shaped clip. Since the "W" shaped clip, the polishing of the surface is not needed and that step is complete eliminated resulting in much simplified and cost effective packaging.

Figure 3A:
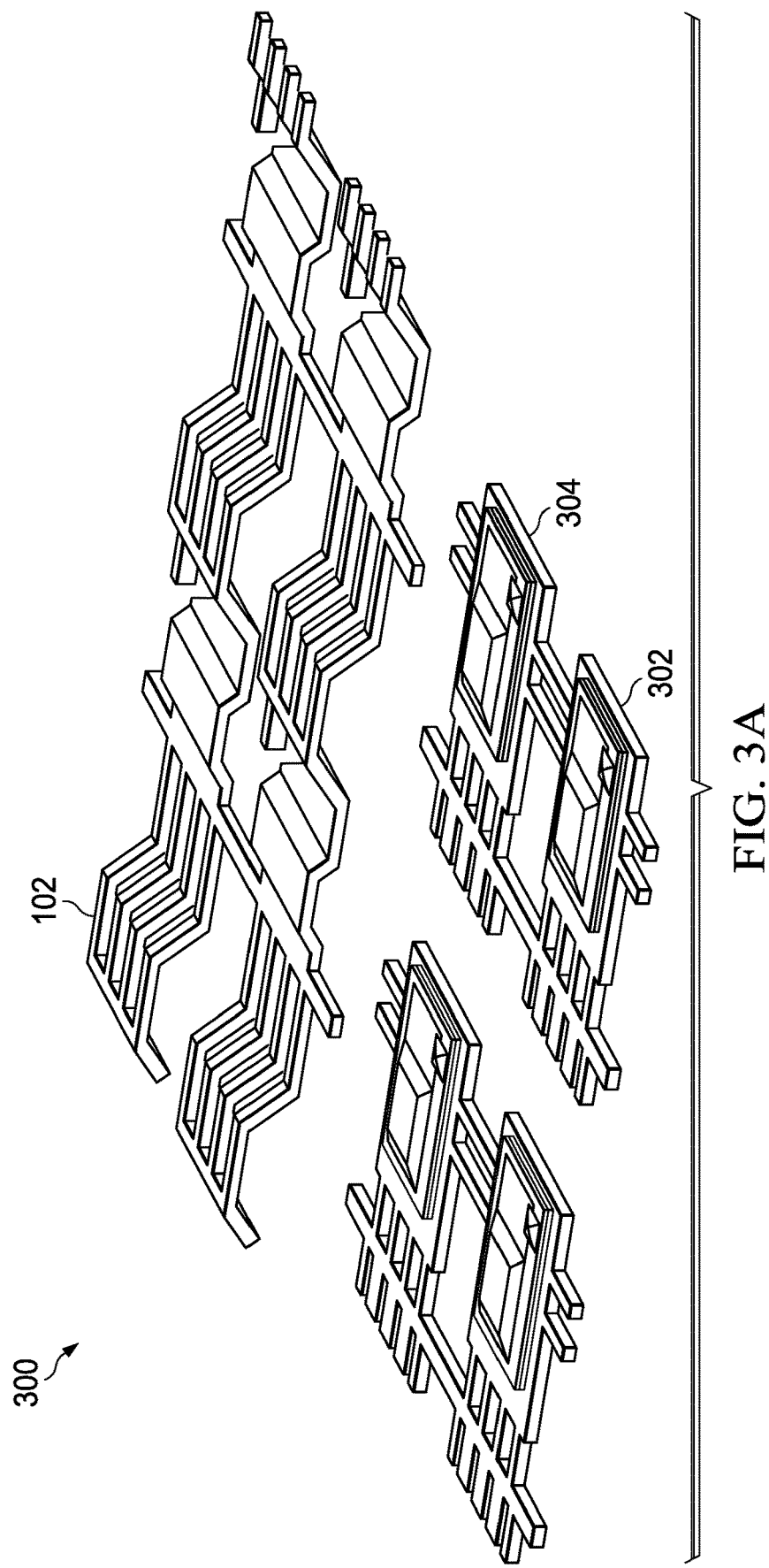
FIG. 3A illustrates an example die bonding process according to some embodiment.
Figure 3B:
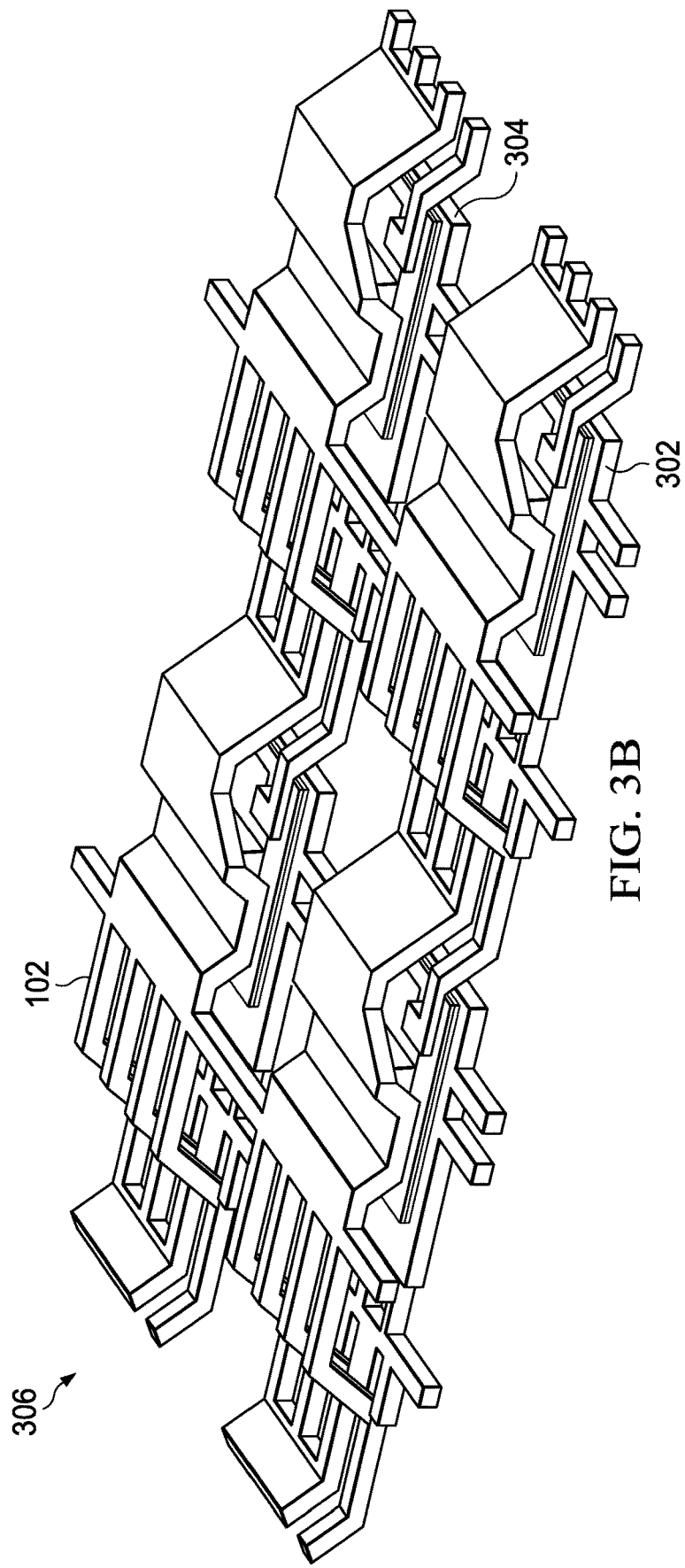
FIG. 3B illustrates an example superimposition and solder paste process according to some embodiment.
Figure 3C:
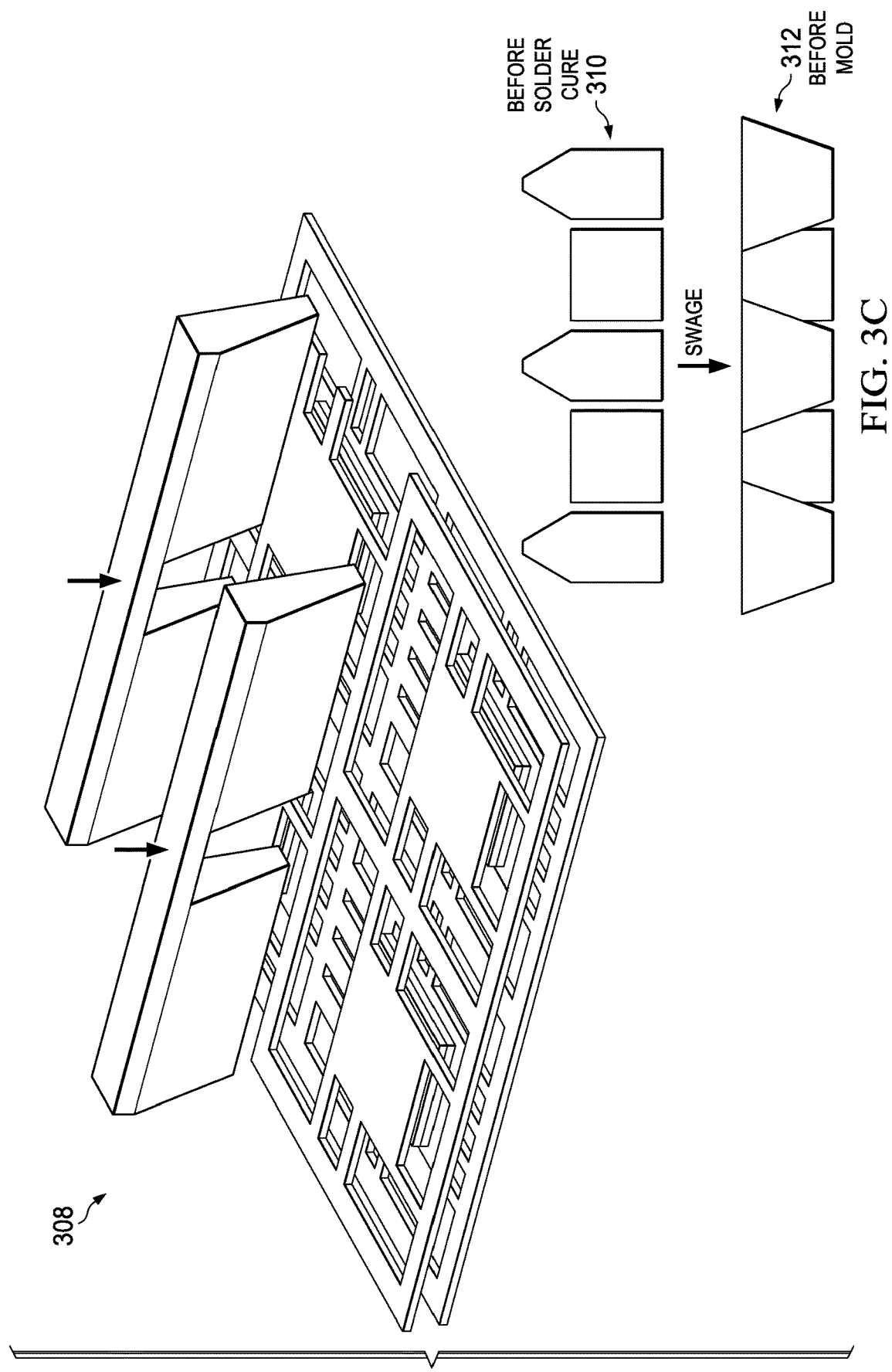
FIG. 3C illustrates an example swage process according to some embodiment.

Referring to FIG. 3A, a process 300 for bonding dies is shown. In this example MOSFETs as represented by MOSFET 302 and MOSFET 304 are bonded to a chip package. As shown in FIG. 3B, in a process 306, the "W" shaped clip or frame 102 is superimposed over the dies or MOSFET 302 and MOSFET 304. The superimposing may include performing a solder paste. FIG. 3C illustrates swaging of the "W" shaped clip or frame and bonded dies. The swaging involves pressing the components together. Cross sectional view 310 shows components before the swaging, and cross sectional view 312 shows the components after the swaging.

Figure 3D:
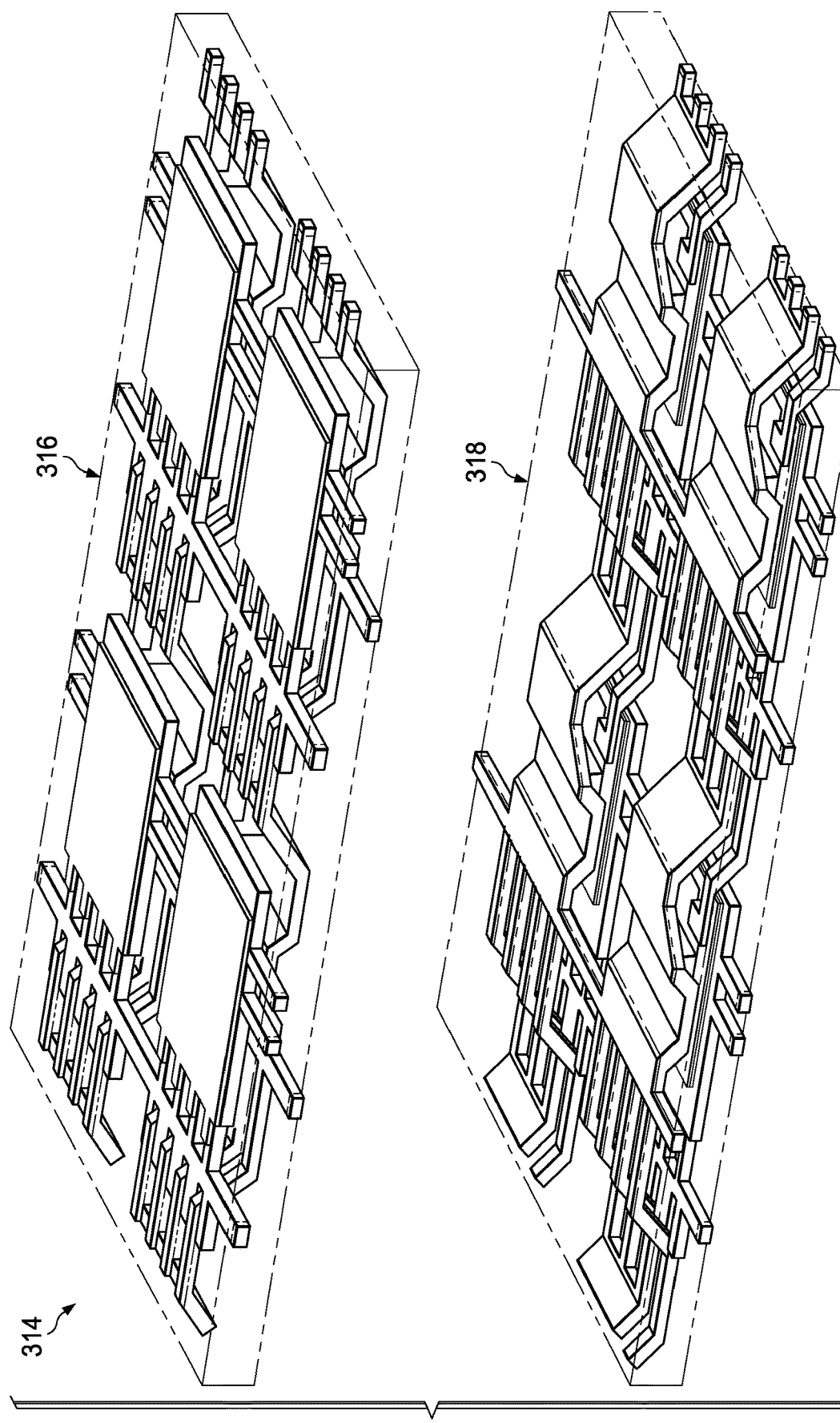
FIG. 3D illustrates an example molding process according to some embodiment.

Referring to FIG. 3D, molding of the chip package 314 is shown. In particular, an upside mold die and a downside mold die are used. The chip package is dual sided, having a top side 316 and a downside 318. Since after the molding, both sides of the chip package are exposed, no additional polishing is needed. Referring to FIG. 3E, singulation of the chip package is shown. In particular, the chip package 322 is singulated, such as with a "saw" 324. Singulation of chip package 322 is performed at the joints 326 of the heat sink frame, cutting the W" shaped clip or frame 102.

Figure 4A:
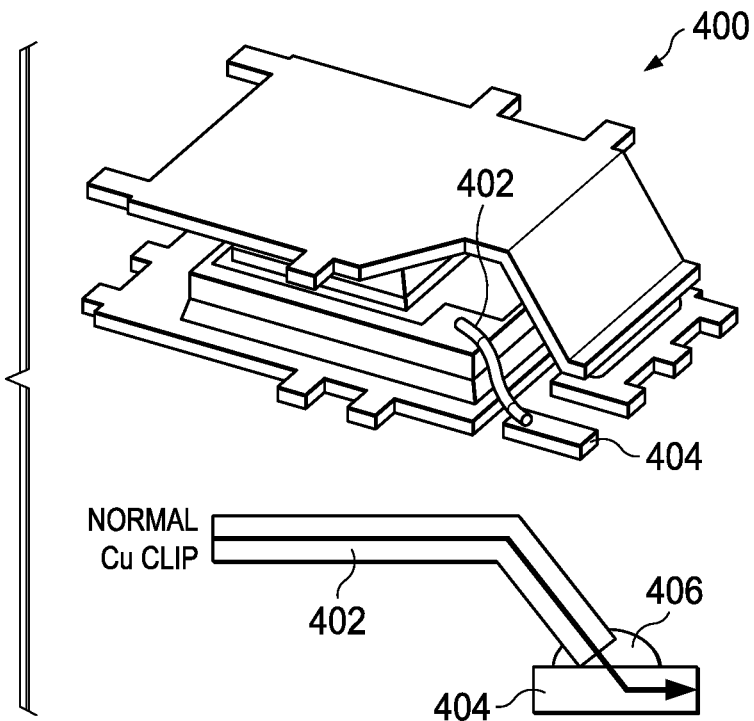
FIG. 4A illustrates prior art frame clipping structure.

Referring to FIG. 4A, a prior art frame clipping structure is shown. The structure 400 includes an electrically conductive clip 402, which may be copper (Cu) that connects to a conductive contact 404, which may also be copper. The conductive clip is connected by a solder bond 406. Series resistance for electrical conductivity from the structure to contact point may be summed up as: resistance of the clip+resistance of the clip solder contact+resistance of the solder+resistance of solder lead contact+resistance of contact lead.

Figure 4B:
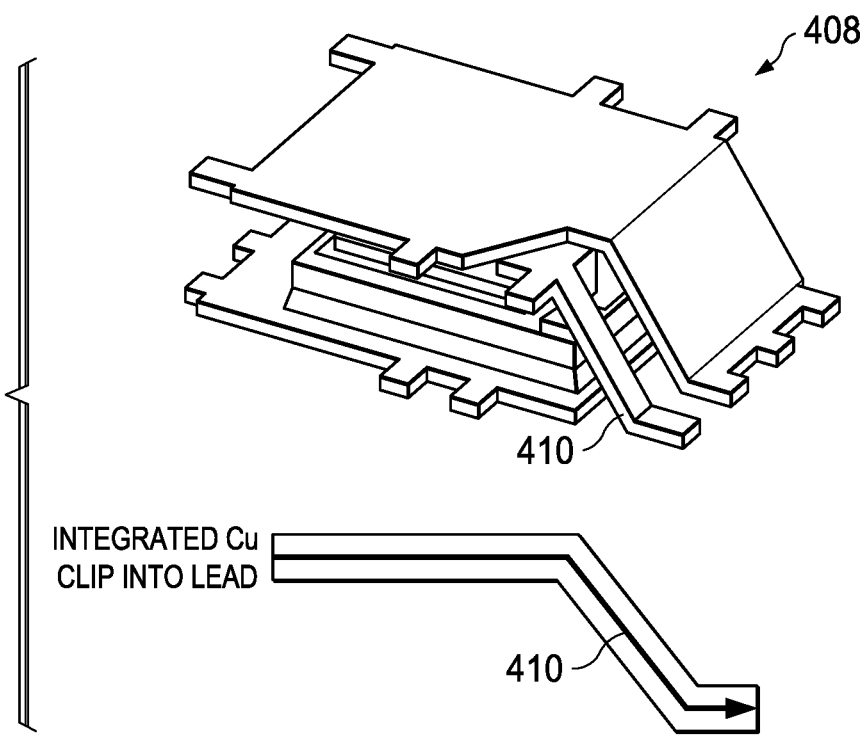
FIG. 4B illustrates an example integrated frame clipping structure according to some embodiment.

Referring to FIG. 4B is an example integrated frame clipping structure 408 according to an embodiment. An integrated conductive clip 410 is part of the "W" shaped clip or frame. The integrated clip and the "W" shaped clip or frame may be made of copper or similarly conductive material. In contrast to the prior art structure of FIG. 4A, contact points and solders are eliminated in the example embodiment. In the present embodiment, the resistance for electrical conductivity from the structure 408 is simply the resistance of the clip lead. This provides significant improvement in conductivity and in addition, thermal/heat dispersion is also improved in the structure of FIG. 4B, especially when material such as copper is used where copper's thermal conductivity is about 398 W/mK and solder is about 30 W/mK.

Figure 5:
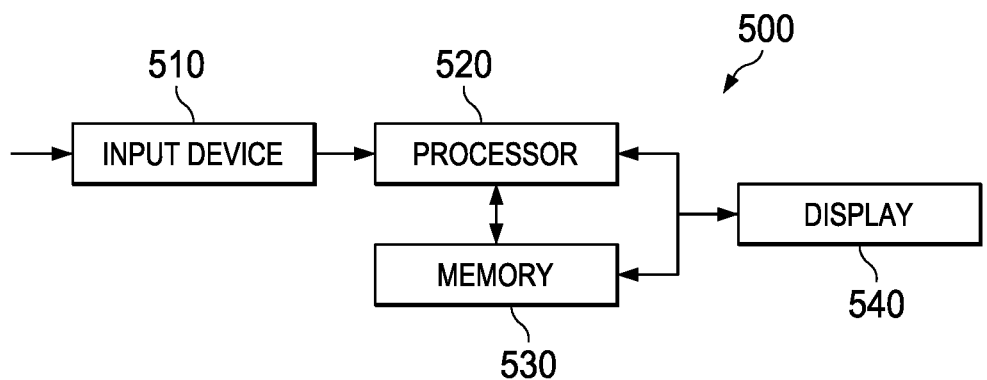
FIG. 5 illustrates an example of a system using semiconductor chip packaging according to some embodiment.

Referring to FIG. 5, an example of system 500 is illustrated according to some embodiment. System 500 can be any system configured to use semiconductor chips packages according to an embodiment. System 500 can be an individual system unit such as a computing device, mobile phone, electronic control device, or any other electronic device including various processing components using semiconductor chip packages or system 500 can a be an integrated system-on-a-chip (SoC) on a single semiconductor chip package including various different components illustrated in FIG. 5 and others not shown as necessary to perform functions necessary for a given application.

System 500 includes an input device 510. Input device 510 can be any processing unit configured to receive data input including but not limited to an analogue-to-digital converter, baseband processing chip, transceiver for a mobile device, keyboard, or the like various other means for receiving input signals. The processor 520 can be any general purpose or specific application processing unit configured to process signals and data. Memory 530 can be any memory known in the art to store data and programs for the system 500. Display 540 can be configured to display data, video, graphics and similar other depictions. As described hereinabove, all or some of the components of system 500 can be integrated into a SoC for example, the processor can be an integrated chipset including memory, input device, and other processing components or the like or there can be more than one processor performing various functions. The processor 520 itself can be a combination of processors and other auxiliary components necessary for the processor to perform desired functions. Further, the memory 530 can be integrated into the processor as internal memory or can be an independent memory unit configured to interact with one or more processors.

The foregoing outlines features of several embodiments so that those of ordinary skill in the art may better understand various aspects of the present disclosure. Those of ordinary skill in the art should appreciate that they may readily use the present disclosure as a basis for designing or modifying other processes and structures for carrying out the same purposes and/or achieving the same advantages of various embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

Although the subject matter has been described in language specific to structural features or methodological acts, it is to be understood that the subject matter of the appended claims is not necessarily limited to the specific features or acts described above. Rather, the specific features and acts described above are disclosed as example forms of implementing at least some of the claims. Various operations of embodiments are provided herein. The order in which some or all of the operations are described should not be construed to imply that these operations are necessarily order dependent. Alternative ordering will be appreciated having the benefit of this description. Further, it will be understood that not all operations are necessarily present in each embodiment provided herein. Also, it will be understood that not all operations are necessary in some embodiments.

Moreover, "exemplary" is used herein to mean serving as an example, instance, illustration, etc., and not necessarily as advantageous. Also, although the disclosure has been shown and described with respect to one or more implementations, equivalent alterations and modifications will occur to others of ordinary skill in the art based upon a reading and understanding of this specification and the annexed drawings. The disclosure comprises all such modifications and alterations and is limited only by the scope of the following claims. In particular regard to the various functions performed by the above described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure. In addition, while a particular feature of the disclosure may have been disclosed with respect to only one of several implementations, such feature may be combined with one or more other features of the other implementations as may be desired and advantageous for any given or particular application.

What is claimed is:

1. A method for forming a dual sided chip package comprising:
    forming solder on a semiconductor die;
    superimposing a frame on the solder over the semiconductor die;
    swaging the frame and the semiconductor die between an upside mold die and a downside mold die, wherein:
        the frame extends from the upside mold die to the downside mold die; and
        the frame is recessed from the upside mold die where the frame contacts the solder over the semiconductor die;
    curing the solder;
    molding the frame to the semiconductor die with the upside mold die and the downside mold die; and
    singulating the frame, wherein heatsink surfaces of the frame are exposed at a first surface of the dual sided chip package and at a second surface of the dual sided chip package, opposite from the first surface.

2. The method of claim 1, wherein the frame is configured as "W" shaped frame.

3. The method of claim 1, wherein the frame is electrically conductive.

4. The method of claim 1, wherein the frame is further configured as contact leads for the dual sided chip package.

5. The method of claim 1, wherein the frame is configured to dissipate heat.

6. The method of claim 1, the semiconductor die includes MOSFET components.

7. The method of claim 1, wherein the frame is configured in corrugated shape.

8. A method for forming a dual sided chip package comprising:
    superimposing an electrically conductive W shaped frame clip which possesses structural strength to support against an upside die mold and a downside die mold to one or more dies and provide a conductive path to the one or more dies;
    bonding the W shaped frame clip to the one or more dies;
    molding the W shaped frame clip to the one or more dies with the upside die mold and the downside mold; and
    singulating the W shaped frame clip, wherein the W shaped frame clip extends from the upside die mold to the downside die mold, and wherein the W shaped frame clip includes a recessed portion where it contacts the one of more dies.

* * * * *